(12) United States Patent
Chen et al.

(10) Patent No.: US 8,624,376 B1
(45) Date of Patent: Jan. 7, 2014

(54) PACKAGE-ON-PACKAGE STRUCTURE WITHOUT THROUGH ASSEMBLY VIAS

(71) Applicant: Taiwan Semiconductor Manufacturing Company, Ltd., Hsin-Chu (TW)

(72) Inventors: Chih-Hua Chen, Jhubei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/649,031

(22) Filed: Oct. 10, 2012

(51) Int. Cl.
*H03H 7/38* (2006.01)

(52) U.S. Cl.
USPC .......................... 257/686; 257/723; 257/421

(58) Field of Classification Search
USPC .......................... 257/686, 723, 421, 774, 528
See application file for complete search history.

(56) References Cited

U.S. PATENT DOCUMENTS

| | | | | |
|---|---|---|---|---|
| 6,054,329 | A * | 4/2000 | Burghartz et al. | 438/3 |
| 6,798,327 | B2 * | 9/2004 | Yu et al. | 336/200 |
| 2011/0001587 | A1 * | 1/2011 | Sutardja | 333/24 R |
| 2011/0050357 | A1 * | 3/2011 | Kim et al. | 333/32 |
| 2012/0064827 | A1 * | 3/2012 | Kim et al. | 455/41.1 |

* cited by examiner

*Primary Examiner* — Roy Potter
(74) *Attorney, Agent, or Firm* — Slater & Matsil, L.L.P.

(57) ABSTRACT

A package-on-package (PoP) device including a top package and a bottom package including a first inductor and a second inductor on opposing sides of a wafer mold layer outside of a die area, the first inductor aligned with the second inductor to electrically couple the top package to a redistribution layer of the bottom package.

20 Claims, 7 Drawing Sheets

- Carrier de bond
- Backside RDL

• Die attach

• Wafer molding

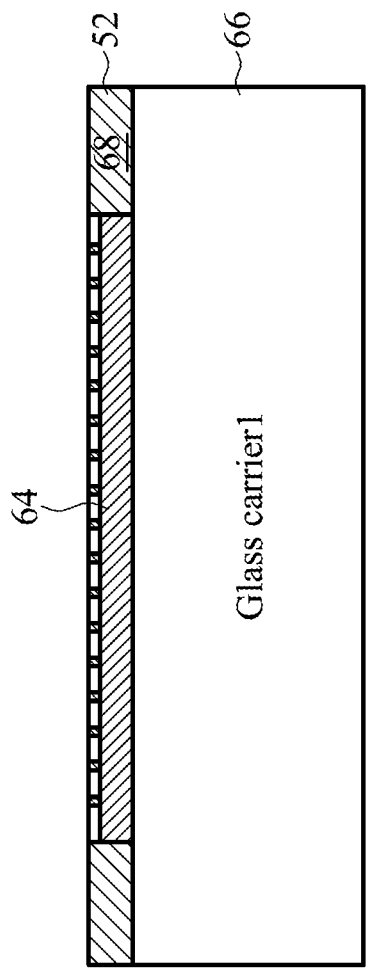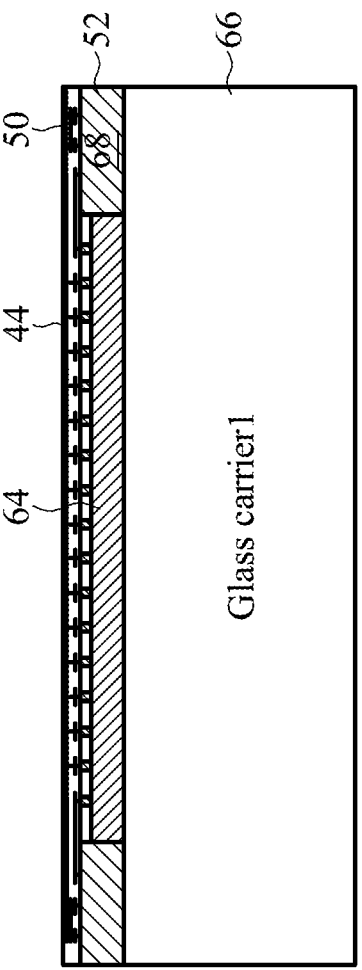

PACKAGE-ON-PACKAGE STRUCTURE WITHOUT THROUGH ASSEMBLY VIAS

BACKGROUND

As the demand for smaller electronic products grows, manufacturers and others in the electronics industry continually seek ways to reduce the size of integrated circuits used in the electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic packages. In PoP package designs, the top package may be interconnected to the bottom package using through assembly vias (TAVs) and/or solder balls in a ball grid array (BGA). Unfortunately, the TAVs and the BGA solder balls may present undesirable limitations.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 4a-4g collectively illustrate an embodiment method of forming the PoP device of FIG. 2.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a package-on-package (PoP) semiconductor device. The concepts in the disclosure may also apply, however, to other semiconductor structures or circuits.

Figure 1:
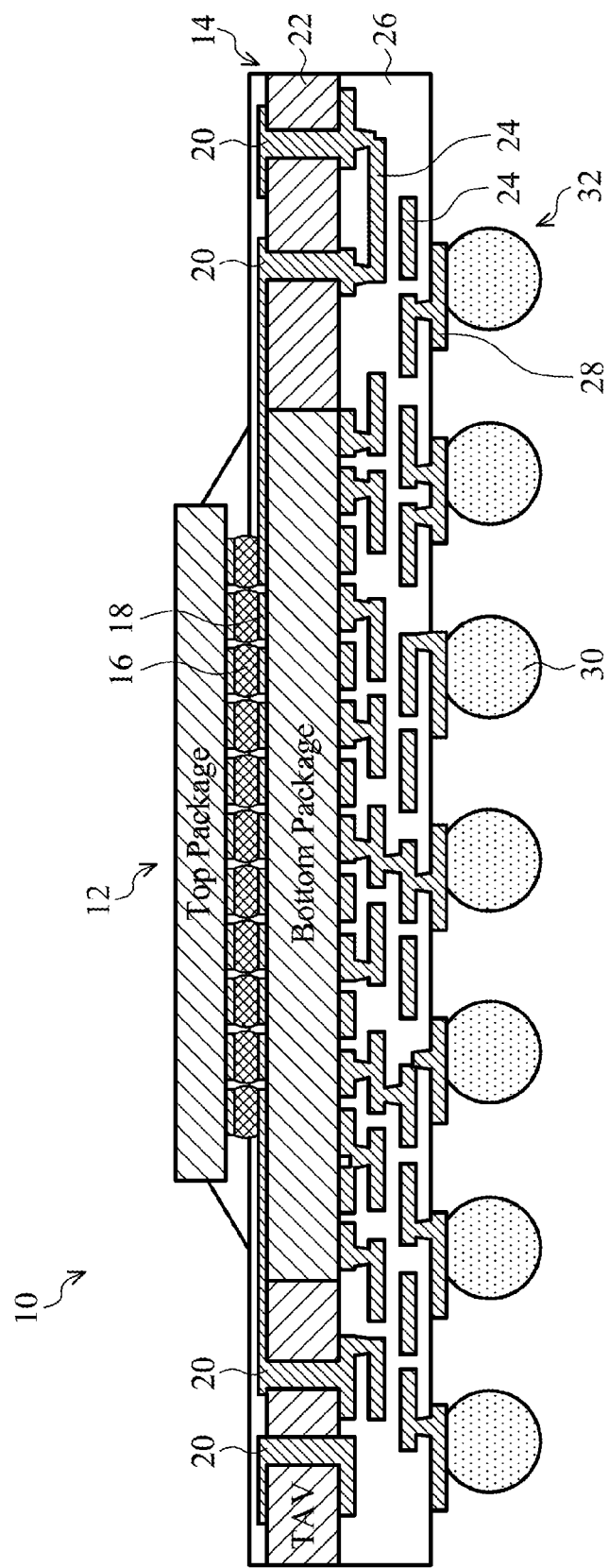
FIG. 1 illustrates a cross sectional view of a conventional package-on-package (PoP) device having through assembly vias (TAVs)

Referring to FIG. 1, a conventional PoP device 10 is illustrated. The PoP device 10 generally includes a top package 12 and a bottom package 14. The top package 12 may include, for example, vertically discrete memory components while the bottom package 14 may include a logic component (a logic integrated circuit, analog circuit, and so on).

The top package 12 may be mounted to the bottom package 14 using, for example, a flip-chip bonding process such as chip-on-wafer (CoW). As such, the top package 12 and the bottom package 14 are electrically and mechanically coupled to each other through a plurality of solder bumps 16 and top contacts 18.

The top and bottom packages 12, 14 are also electrically coupled to each other by way of through assembly vias (TAVs) 20. The through assembly vias 20, which may also be known as through mold vias (TMVs) if formed in a wafer mold layer 22 of the PoP device 10, generally extend vertically through a portion of the bottom package 14. As shown, the through assembly vias 20 extend between one of the top contacts 18 and one of the redistribution layers 24 formed in a substrate 26 of the bottom package 14. As such, the top contacts 18 are electrically coupled to the top redistribution layer 24 in the bottom package 14. As shown, the redistribution layers 24, along with bottom contacts 28 and solder balls 30 in a ball grid array (BGA) 32, may be employed to electrically couple the entire PoP device 10 to other electronic circuitry such as, for example, a printed circuit board (not shown).

Figure 2:
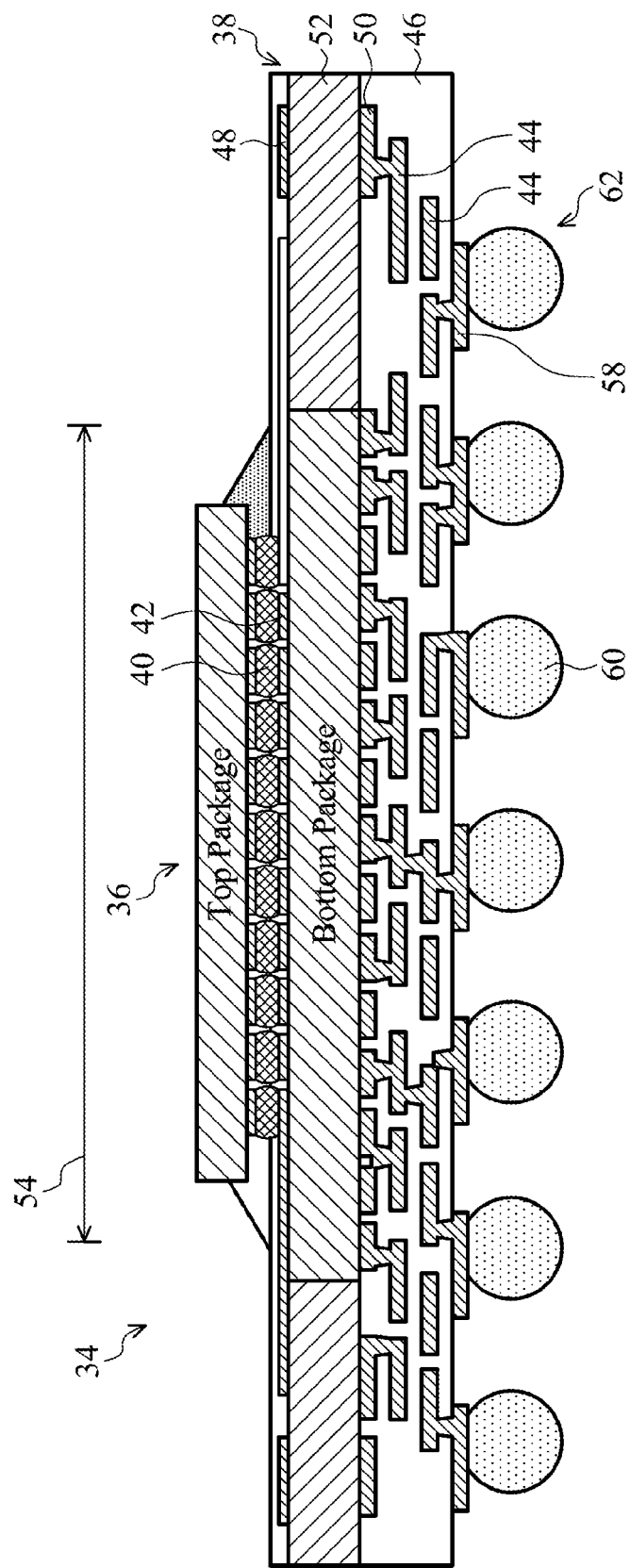
FIG. 2 illustrates a cross sectional view of an embodiment PoP device wherein the TAVs of FIG. 1 have been replaced by opposing inductors.

Referring now to FIG. 2, a PoP device 34 in accordance with various embodiments of the present disclosure is illustrated. The PoP device 34 generally includes a top package 36 and a bottom package 38. The top package 34 may include, for example, vertically discrete memory components while the bottom package 38 may include a logic component (a logic integrated circuit, analog circuit, and so on). In some embodiments, the top and bottom packages 36, 38 may include a variety of other electronic devices and/or circuitry as well.

The top package 36 may be mounted to the bottom package 38 using, for example, a flip-chip bonding process such as chip-on-wafer (CoW). As such, the top package 36 and the bottom package 38 are electrically and mechanically coupled to each other through a plurality of solder bumps 40 and top contacts 42.

In contrast to the PoP device 10 of FIG. 1, the top package 36 of the PoP device 34 in FIG. 2 is electrically coupled to a redistribution layer 44 in a substrate 46 of the bottom package 38 by a first inductor 48 and a second inductor 50. In other words, the PoP device 34 includes pairs of inductors 48, 50 on opposing sides of a wafer mold layer 52 instead of using the through assembly vias 20 found in the PoP device 10 of FIG. 1. Indeed, the wafer mold layer 52 of the PoP device 10 in FIG. 2 is free of through assembly vias 20 (FIG. 1). In an embodiment, the first inductor 48 is physically and electrically connected to one or more contacts 42, the second inductor 50 is physically and electrically connected to the top redistribution layer 44, and the first and second inductors 48, 50 are electrically coupled by inductive coupling. As such, the front side and backside communication in the PoP device 34 may occur through the coupling effect of the first and second inductors 48, 50.

In some embodiments, the first inductor 48 and the second inductor 50 in the PoP device 34 of FIG. 2 are vertically aligned with each other. In other words, the first inductor 48 and the second inductor 50 have profiles that overlap when they are viewed from above or below. In some embodiments, the first inductor 48 and the second inductor 50 in the PoP device 34 of FIG. 2 are disposed outside a die area 54. In some embodiments, the first and second inductors 48, 50 may be formed using a fan out process. In some embodiments, one or both of the first inductor 48 and the second inductor 50 engages the wafer mold layer 52. Also, while a single pair of inductors 48, 50 is depicted on either side of the die area 54 in FIG. 2, more or fewer pairs of the inductors may be included in other embodiments.

Figure 3:
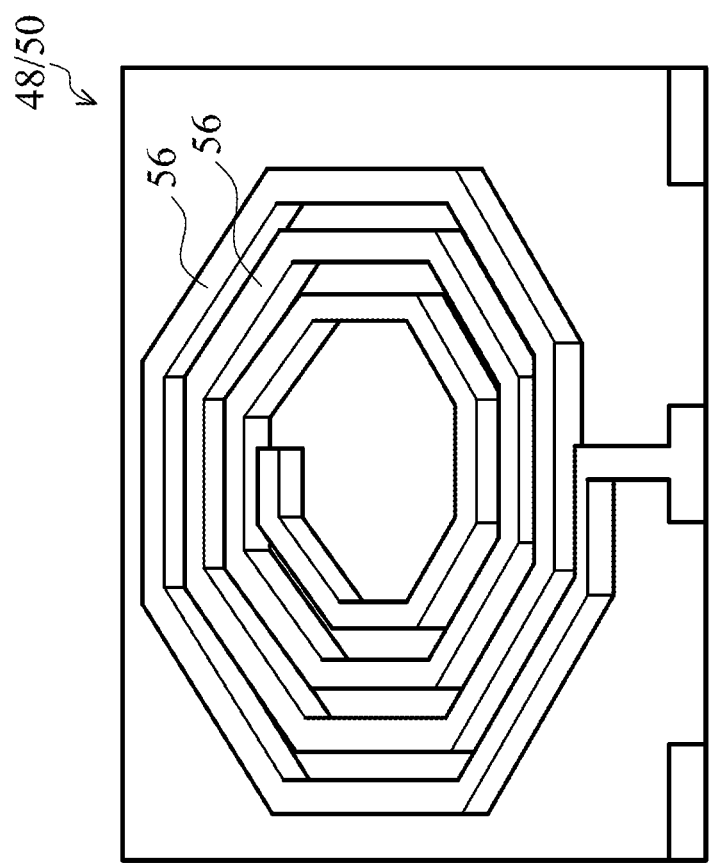
FIG. 3 illustrates one of the inductors of the PoP device of FIG. 2 in greater detail.

Referring now to FIG. 3, one of the inductors (e.g., the first inductor 48 or the second inductor 50) is illustrated in greater detail. As shown, in some embodiments one or both of the first inductor 48 and the second inductor 50 is formed from concentric octagon-shaped rings 56. In some embodiments, the first and second inductors 48, 50 may resemble other shapes or have other configurations. Indeed, the first and second inductors 48, 50 may be formed from concentric rectangles, squares, circles, and so on.

Referring back to FIG. 2, the bottom package 38 also includes bottom contacts 58 and solder balls 60 in a ball grid array (BGA) 62. The bottom contacts 58 and the solder balls 60, which are electrically coupled to the redistribution layers 44 in the bottom package 38, may be employed to electrically couple the entire PoP device 34 to other electronic circuitry such as, for example, a printed circuit board (not shown).

Figure 4A:
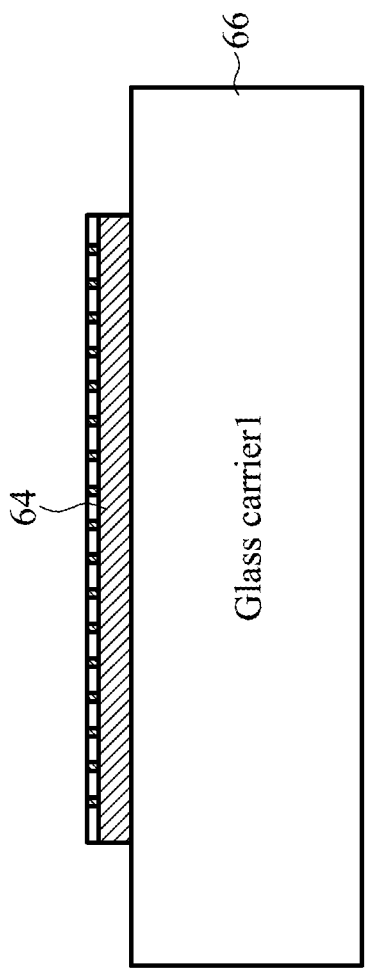
Figure 4B:
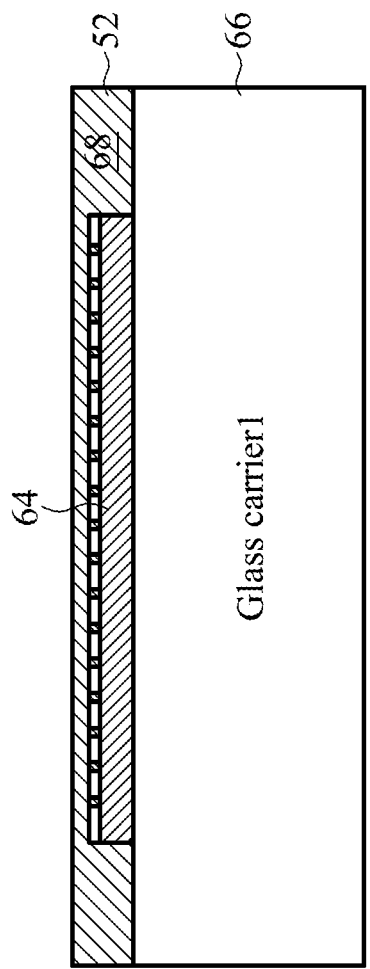

Referring now to FIGS. 4a-4g, a method of forming the PoP device 34 of FIG. 2 in accordance with various embodiments of the present disclosure is collectively illustrated. As shown in FIG. 4a, a die 64 (which defines the die area 54 of FIG. 2) is attached to a glass carrier 66. Thereafter, as shown in FIG. 4b, a wafer molding material 68 is applied to provide for the wafer mold layer 52. Next, as shown in FIG. 4c, a wafer grinding process takes place to remove an excess portion of the wafer mold layer 52. Next, as shown in FIG. 4d, redistribution layer (RDL) stacking is performed to provide the redistribution layer 44 metallization and, in particular, to form the second inductor 50.

Figure 4E:
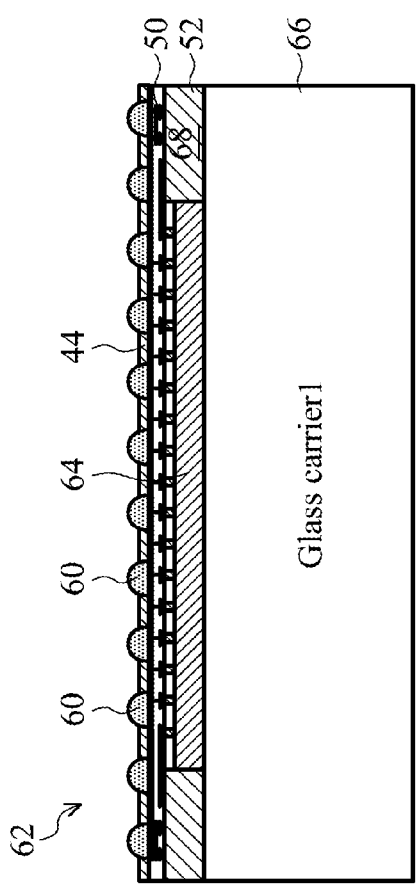
Figure 4F:
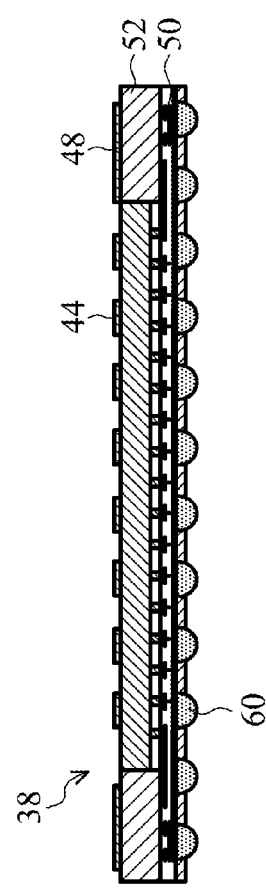

Referring now to FIG. 4e, testing is conducted to test the redistribution layer 44 metallization and/or the function of the attached die 64. Thereafter, the solder balls 60 are provided to form the ball grid array 62. Next, as shown in FIG. 4f, the glass carrier 66 (FIG. 4e) is removed and a backside redistribution layer (RDL) process is performed to provide further redistribution layer 44 metallization and, in particular, to form the first inductor 48. In an embodiment, this generally completes the bottom package 38.

Figure 4G:
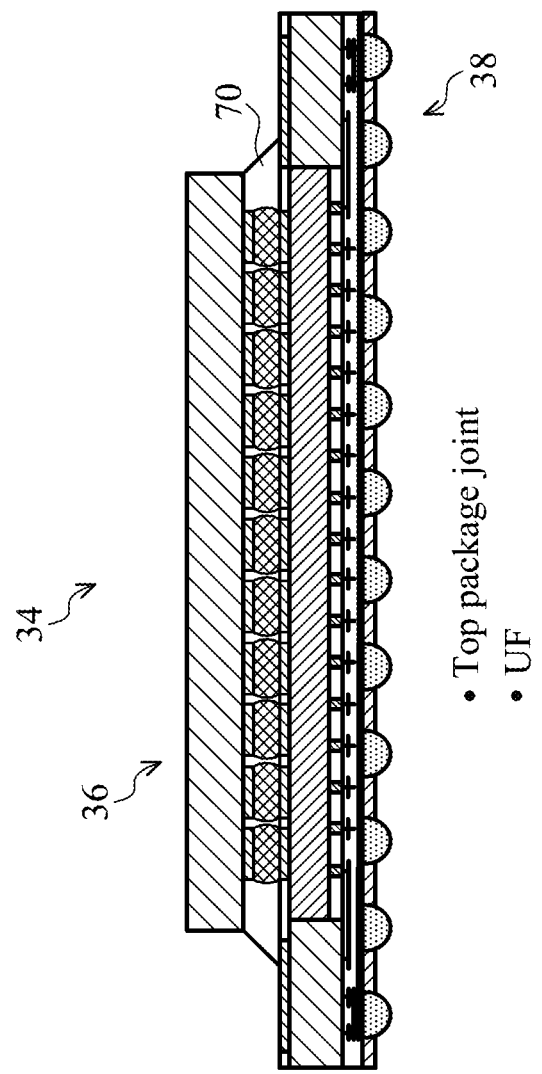

Thereafter, as shown in FIG. 4g, the top package 36 is mounted to the bottom package 38 and an underfill material 70 is provided in, for example, a flip-chip bonding process such as chip-on-wafer (CoW) to form the PoP device 34. Other suitable processes of mounting packages or components to each other may also be employed in other embodiments. Indeed, additional or further processing steps may not have been described for brevity and simplicity of explanation.

It should be recognized that the PoP device 34 of FIG. 2 provides numerous advantages relative to conventional PoP devices that rely on TAVs, TMVs, and the like. For example, the PoP device 34 of FIG. 2 may have a smaller vertical profile. In other words, the thickness of the PoP device 34 of FIG. 2 is less than conventional PoP devices due to the elimination of the TAVs, TMVs, and the like. In addition, the PoP device 34 has a low cost and is suitable for low pin count applications.

A package-on-package (PoP) device including a top package and a bottom package including a first inductor and a second inductor on opposing sides of a wafer mold layer outside of a die area, the first inductor aligned with the second inductor to electrically couple the top package to a redistribution layer of the bottom package.

A package-on-package (PoP) device including a top package and a bottom package including a pair of vertically-aligned inductors spaced apart by a wafer mold material outside of a die area, the pair of vertically-aligned inductors configured to electrically couple the top package to a redistribution layer in a substrate of the bottom package.

A method of forming package-on-package (PoP) device including forming a first inductor on a first side of a wafer mold layer outside of a die area in a bottom package, forming a second inductor on a second side of a wafer mold layer outside of the die area in the bottom package, the second inductor vertically aligned with the first inductor, and mounting a top package to the bottom package, the first and second inductors electrically coupling the top package to a redistribution layer of the bottom package.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A package-on-package (PoP) device, comprising:
a top package; and
a bottom package including a first inductor and a second inductor on opposing sides of a wafer mold layer outside of a die area, the first inductor aligned with the second inductor to electrically couple the top package to a redistribution layer of the bottom package.

2. The PoP device of claim 1, wherein the mold material is free of a through mold via electrically coupling the top package to the redistribution layer of the bottom package.

3. The PoP device of claim 1, wherein the first inductor is vertically aligned with the second inductor.

4. The PoP device of claim 1, wherein the first inductor and the second inductor have profiles that overlap when viewed from above and below.

5. The PoP device of claim 1, wherein the first inductor and the second inductor are each formed from concentric octagon-shaped rings.

6. The PoP device of claim 1, wherein the first inductor and the second inductor each engage the wafer mold layer.

7. The PoP device of claim 1, wherein the bottom package includes a ball grid array configured to electrically couple the bottom package to additional circuitry.

8. The PoP device of claim 1, wherein the top package includes at least one memory chip.

9. The PoP device of claim 1, wherein the bottom package includes at least one logic device.

10. A package-on-package (PoP) device, comprising:
a top package; and
a bottom package including a pair of vertically-aligned inductors spaced apart by a wafer mold material outside of a die area, the pair of vertically-aligned inductors configured to electrically couple the top package to a redistribution layer in a substrate of the bottom package.

11. The PoP device of claim 10, wherein the bottom package includes a second pair of vertically-aligned inductors spaced apart by the wafer mold material, the pair of vertically-aligned inductors and the second pair of vertically-aligned inductors on opposing sides of the die area.

12. The PoP device of claim 10, wherein the mold material is free of a through mold via electrically coupling the top package to the redistribution layer of the bottom package.

13. The PoP device of claim 10, wherein the pair of vertically-aligned inductors includes a first inductor and a second inductor, the first and second inductors having overlapping profiles when viewed from above and below.

14. The PoP device of claim 10, wherein the pair of vertically-aligned inductors includes a first inductor and a second inductor, the first inductor and the second inductor each formed from concentric octagon-shaped rings.

15. The PoP device of claim 10, wherein each of the pair of vertically-aligned inductors is engaged with the wafer mold layer.

16. The PoP device of claim 10, wherein the top package includes at least one memory chip.

17. The PoP device of claim 10, wherein the bottom package includes at least one logic device.

18. A method of forming package-on-package (PoP) device, comprising:
   forming a first inductor on a first side of a wafer mold layer outside of a die area in a bottom package;
   forming a second inductor on a second side of a wafer mold layer outside of the die area in the bottom package, the second inductor vertically aligned with the first inductor; and
   mounting a top package to the bottom package, the first and second inductors electrically coupling the top package to a redistribution layer of the bottom package.

19. The method of claim 18, further comprising maintaining the wafer mold layer free of a through assembly via.

20. The method of claim 18, wherein at least one of the first inductor and the second inductor engage the wafer mold layer.

\* \* \* \* \*